United States Patent
Dono et al.

(10) Patent No.: US 9,030,888 B2
(45) Date of Patent: May 12, 2015

(54) SEMICONDUCTOR DEVICE HAVING OUTPUT BUFFER CIRCUIT IN WHICH IMPEDANCE THEREOF CAN BE CONTROLLED

(75) Inventors: Chiaki Dono, Chuo-ku (JP); Shinya Miyazaki, Kokubunji (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 224 days.

(21) Appl. No.: 13/617,447

(22) Filed: Sep. 14, 2012

(65) Prior Publication Data
US 2013/0083609 A1  Apr. 4, 2013

(30) Foreign Application Priority Data
Sep. 29, 2011 (JP) ................................. 2011-213702

(51) Int. Cl.
*G11C 7/10* (2006.01)
(52) U.S. Cl.
CPC .................................. *G11C 7/1057* (2013.01)
(58) Field of Classification Search
USPC ........................................ 365/189.05, 230.08
See application file for complete search history.

(56) References Cited

U.S. PATENT DOCUMENTS

| | | | |
|---|---|---|---|
| 6,765,842 B2 * | 7/2004 | Kim | 365/230.03 |
| 7,215,128 B2 | 5/2007 | Fujisawa | |
| 7,495,453 B2 | 2/2009 | Fujisawa | |
| 7,808,270 B2 | 10/2010 | Fujisawa | |
| 7,868,659 B2 * | 1/2011 | Ker et al. | 326/81 |
| 8,198,911 B2 | 6/2012 | Fujisawa | |
| 8,264,257 B2 * | 9/2012 | Demange | 327/112 |
| 8,335,116 B2 * | 12/2012 | Matsushige et al. | 365/189.05 |
| 2006/0158198 A1 | 7/2006 | Fujisawa | |
| 2007/0194798 A1 | 8/2007 | Fujisawa | |
| 2009/0146756 A1 | 6/2009 | Fujisawa | |
| 2011/0001511 A1 | 1/2011 | Fujisawa | |
| 2012/0217992 A1 | 8/2012 | Fujisawa | |

FOREIGN PATENT DOCUMENTS

JP  2006-203405 A  8/2006

* cited by examiner

*Primary Examiner* — Pho M Luu (57) ABSTRACT

A device that includes first and second buffer circuits electrically connected to a terminal and an output control circuit activating the first buffer circuit and deactivating the second buffer circuit in a first state and activating one of the first and second buffer circuits and deactivating the other of the first and second buffer circuits based on input data in a second state. The output control circuit is brought into one of the first and second states.

18 Claims, 11 Drawing Sheets

| IODT | DRV | OUTPUT |
|---|---|---|
| "L" | "L" | ODTC |
|  | "H" | RONC |
| "H" | "L" | All "L" |
|  | "H" | RONC |

SEMICONDUCTOR DEVICE HAVING OUTPUT BUFFER CIRCUIT IN WHICH IMPEDANCE THEREOF CAN BE CONTROLLED

BACKGROUND OF THE INVENTION

1. Field of the Invention

The present invention relates to semiconductor devices and controlling methods thereof and, in particular, relates to a semiconductor device including an output buffer circuit and a controlling method thereof.

2. Description of Related Art

In semiconductor devices such as DRAM (Dynamic Random Access Memory), an output buffer circuit is provided for outputting a data signal to the outside of the semiconductor device. Some of versatile semiconductor devices, in particular, are configured to be able to select impedance of the output buffer circuit (See Japanese Patent Application Laid-open No. 2006-203405).

As disclosed in Japanese Patent Application Laid-open No. 2006-203405, the output buffer circuit has the structure in which a pull-up buffer circuit consisting of p-channel MOS transistors and a pull-down buffer circuit consisting of n-channel MOS transistors are connected in series. A data terminal is connected to a contact node between the pull-up buffer circuit and the pull-down buffer circuit. When a high-level data signal is outputted from the data terminal, it is controlled in such a manner that the pull-up buffer circuit is turned on and the pull-down buffer circuit is turned off. On the other hand, when a low-level data signal is outputted from the data terminal, it is controlled in such a manner that the pull-up buffer circuit is turned off and the pull-down buffer circuit is turned on.

During a period when the data signal is not outputted from the data terminal, however, it is necessary to allow the output buffer circuit to be in a high impedance state or to function as a termination resistor having predetermined impedance. The function of the output buffer circuit as the termination resistor is referred to as ODT (On Die Termination).

In order to allow the output buffer circuit to be in the high impedance state, it is necessary to turn off both of the pull-up buffer circuit and the pull-down buffer circuit. With DDR3 (Double Data Rate 3) SDRAM (Synchronous DRAM), both of the pull-up buffer circuit and the pull-down buffer circuit need to be turned on when the output buffer circuit performs ODT operation. Thus, it is necessary for the DDR3 SDRAM to deal with four cases in total, that is, the case where only the pull-up buffer circuit is turned on, the case where only the pull-down buffer circuit is turned on, the case where both of the buffer circuits are turned on, and the case where both of the buffer circuit are turned off. Therefore, operation of the pull-up buffer circuit and operation of the pull-down buffer circuit need to be controllable separately.

In the DDR3 SDRAM, a termination level of the data terminal is VDD/2, and therefore it is necessary to allow the output buffer circuit to shift from the high impedance state or the CDT state to an output state of the data signal at timing precisely synchronizing with a clock signal. For this purpose, a control signal allowing the output buffer circuit to be in the high impedance state or the CDT state needs to be inputted in a serializer that generates the data signal in synchronism with the clock signal, which causes the problem that a timing margin of the control signal is small.

SUMMARY

In one embodiment, there is provided a semiconductor memory device that includes: a data terminal; a first power supply line supplying a first potential; a second power supply line supplying a second potential different from the first potential; a first buffer circuit coupled between a first power supply line and the data terminal; a second buffer circuit coupled between a second power supply line and the data terminal; a first control circuit activating the first buffer circuit and deactivating the second buffer circuit during a period before a start timing when an output operation of a data signal from the data terminal is started, and activating one of the first and second buffer circuits and deactivating the other of the first and second buffer circuits based on a logic level of the data signal to be outputted from the data terminal during a period after the start timing; a second control circuit controlling an impedance of the first buffer circuit to a first value in a first control state, and controlling an impedance of the activated one of the first and second buffer circuits to a second value in a second control state; and a third control circuit bringing the second control circuit into the first control state before preparation timing prior to the start timing, and bringing the second control circuit into the second control state after the start timing, the third control circuit changing the second control circuit from the first control state to the second control state during a period from the preparation timing to the start timing.

In another embodiment, there is provided a semiconductor device that includes: a first buffer circuit electrically connected to a terminal; a second buffer circuit electrically connected to the terminal; an output control circuit activating the first buffer circuit and deactivating the second buffer circuit in a first state, and activating one of the first and second buffer circuits and deactivating the other of the first and second buffer circuits based on input data in a second state; and a first control circuit bringing the output control circuit into one of at least the first and second states.

In still another embodiment, there is provided a method of controlling a semiconductor device, that includes: activating or deactivating a first buffer circuit and deactivating a second buffer circuit during a first control period, the first and second buffer circuits being electrically connected in series between first and second power supply lines; activating one of the first and second buffer circuits and deactivating the other of the first and second buffer circuits during a second control period based on a logic level of a data signal to be outputted from a data terminal connected between the first and second buffer circuits; setting impedance of the first buffer circuit to a first value during the first control period; setting impedance of the activated one of the first and second buffer circuits to a second value during the second control period; and changing the impedance of the first buffer circuit from the first value to the second value during a third control period that is defined as a period from an end of the first control period to a start of the second control period.

DETAILED DESCRIPTION OF THE EMBODIMENTS

Preferred embodiments of the present invention will be explained below in detail with reference to the accompanying drawings.

Figure 1:
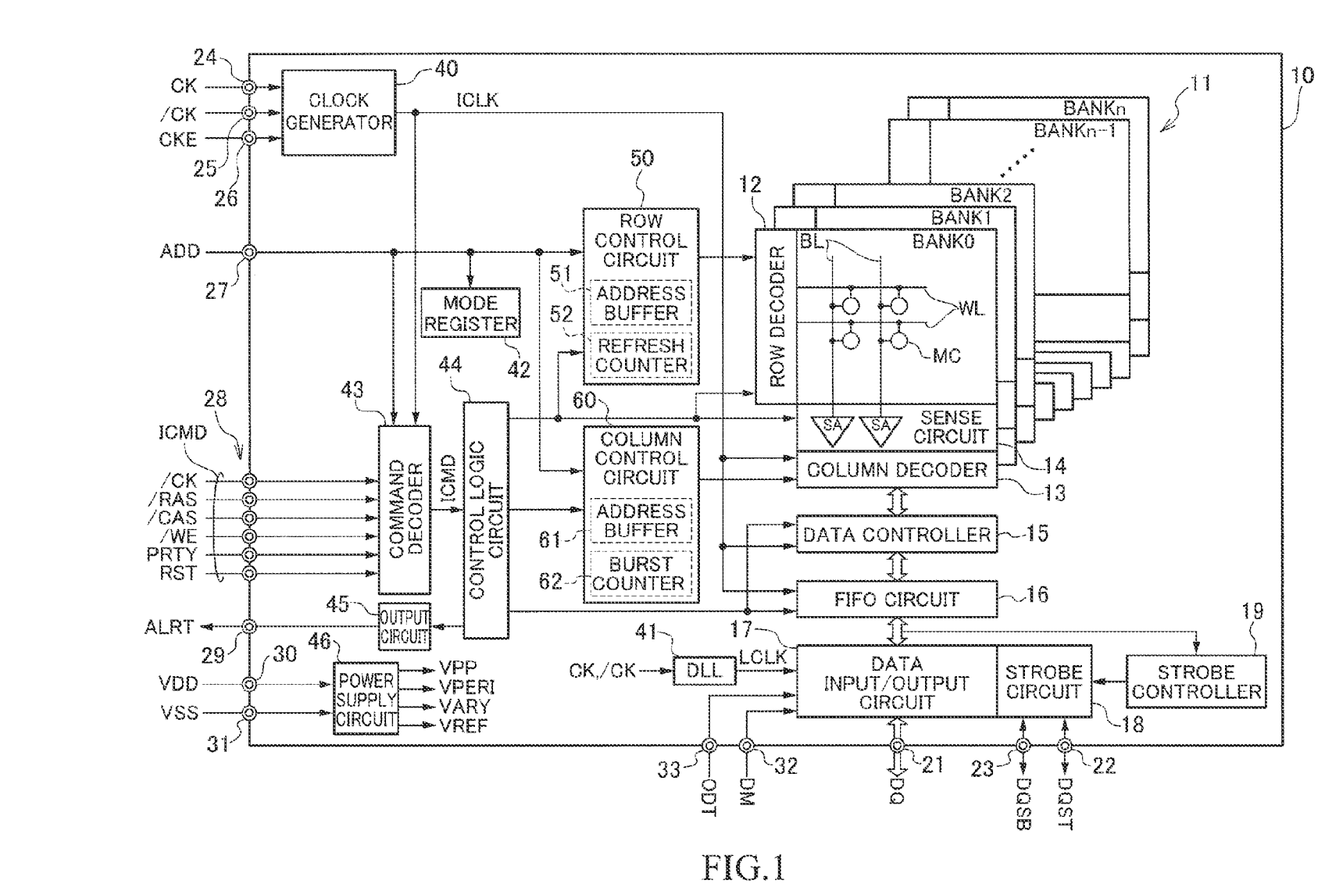
FIG. 1 is a block diagram showing the entire structure of a semiconductor device according to an embodiment of the present invention.

Turning to FIG. 1, the semiconductor device 10 according to this embodiment is DRAM integrated on single semiconductor chip, and includes a memory cell array 11 that is divided into n+1 banks. The bank is a unit capable of executing a command independently, and basically, non-exclusive operation is possible between the banks.

The memory cell array 11 is provided with a plurality of word lines WL and a plurality of bit lines BL that are intersecting each other, and memory cells MC are arranged at points of the intersection. The word line WL is selected by a row decoder 12 and the bit line BL is selected by a column decoder 13. The bit lines BL are respectively connected to corresponding sense amplifiers SA in a sense circuit 14, and the bit line BL that is selected by the column decoder 13 is connected to a data controller 15 via the sense amplifier SA. The data controller 15 is connected to a data input/output circuit 17 via a FIFO circuit 16. The data input/output circuit 17 is a circuit block for inputting/outputting data via a data terminal 21.

The semiconductor device 10 has further external terminals such as strobe terminals 22 and 23, clock terminals 24 and 25, a clock enable terminal 26, an address terminal 27, command terminals 28, an alert terminal 29, power supply terminals 30 and 31, a data mask terminal 32, an ODT terminal 33 and the like.

The strobe terminals 22 and 23 are terminals for inputting/outputting strobe signals DQST and DQSB, respectively. The strobe signals DQST and DQSB are complementary to each other, and define input/output timing of the data to be inputted/outputted via the data terminal 21. Specifically, the strobe signals DQST and DQSB are supplied to a strobe circuit 18 when the data is inputted, that is, during write operation, and based on these signals, the strobe circuit 18 controls operation timing of the data input/output circuit 17. Write data that is inputted via the data terminal 21 is thus received into the data input/output circuit 17 in synchronism with the strobe signals DQST and DQSB. On the other hand, when the data is outputted, that is, during read operation, a strobe controller 19 controls operation of the strobe circuit 18. Read data is thus outputted from the data input/output circuit 17 in synchronism with the strobe signals DQST and DQSB.

The clock terminals 24 and 25 are supplied with external clock signals CK and /CK, respectively. The external clock signals CK and /CK are transferred to a clock generator 40. The signal having "/" before the signal name herein means that the signal is a low active signal or an inverted signal of the corresponding signal. Therefore, the external clock signals CK and /CK are complementary to each other. The clock generator 40 is activated based on a clock enable signal CKE that is supplied via the clock enable terminal 26, to generate an internal clock signal ICLK. The external clock signals CK and /CK that are supplied via the clock terminals 24 and 25 are also supplied to a DLL circuit 41. The DLL circuit 41 is a circuit to generate an output clock signal LCLK that is phase-controlled based on the external clock signals CK and /CK. The output clock signal LCLK is used as a timing signal defining output timing of the read data DQ from the data input/output circuit 17.

The address terminal 27 is supplied with an address signal ADD. The address signal ADD supplied to the address terminal 27 is transferred to a row control circuit 50, a column control circuit 60, a mode register 42, a command decoder 43 and the like. The row control circuit 50 includes an address buffer 51, a refresh counter 52 and the like, and controls the row decoder 12 based on the row address. Further, the column control circuit 60 includes an address buffer 61, a burst counter 62 and the like, and controls the column decoder 13 based on the column address. When a mode register set command is issued, the address signal ADD is supplied to the mode register 42 so as to update the contents of the mode register 42. Impedance codes RONC, ODTC, as will be described later, and the like are also set in the mode register 42.

The command terminals 28 are supplied with a chip select signal /CS, a row address strobe signal /RAS, a column address strobe signal /CAS, a write enable signal /WE, a parity signal PRTY, a reset signal RST and the like. These command signals CMD are transferred to the command decoder 43 and, based on these command signals CMD, the command decoder 43 generates an internal command signal ICMD. The internal command signal ICMD is supplied to a control logic circuit 44. Based on the internal command signal ICMD, the control logic circuit 44 controls operation of the row control circuit 50, the column control circuit 60 and the like.

The command decoder 43 includes a not-shown verification circuit. The verification circuit verifies the address signal ADD and the command signal CMD based on the parity signal PRTY and, if an error is found in the address signal ADD or the command signal CMD as a result of the verification, outputs an alert signal ALRT via the control logic circuit 44 and an output circuit 45. The alert signal ALRT is outputted to the outside via the alert terminal 29.

The power supply terminals 30 and 31 are supplied with power supply potentials VDD and VSS, respectively. The power supply potentials VDD and VSS are supplied to a power supply circuit 46. The power supply circuit 46 is a circuit block to generate various internal potentials based on the power supply potentials VDD and VSS. The internal potentials generated by the power supply circuit 46 include a boosting potential VPP, a power supply potential VPERI, an array potential VARY, a reference potential VREF and the like. The boosting potential VPP is generated by boosting the power supply potential VDD, and the power supply potential VPERI, the array potential VARY and the reference potential VREF are generated by stepping down the power supply potential VDD.

The boosting potential VPP is mainly used in the row decoder 12. The row decoder 12 drives the word line WL, selected based on the address signal ADD, to the VPP level, to thereby allow a cell transistor included in the memory cell MC to conduct. The array potential VARY is mainly used in the sense circuit 14. When the sense circuit 14 is activated, one of a bit line pair is driven to the VARY level and the other is driven to the VSS level, so as to amplify the read data that is read out from the selected memory cell MC. The power supply potential VPERI is used to most peripheral circuits including the row control circuit 50, the column control circuit 60 and the like. As the power supply potential VPERI, whose voltage is lower than that of the power supply potential VDD, is used to these peripheral circuits, it is possible to reduce power consumption of the semiconductor device 10. Further, the reference potential VREF is a potential used in the data input/output circuit 17.

The data mask terminal 32 and the ODT terminal 33 are supplied with a data mask signal DM and a termination signal ODT, respectively. The data mask signal DM and the termination signal ODT are supplied to the data input/output circuit 17. The data mask signal DM is activated when masking a part of the write data and the read data, and the termination signal ODT is activated when using an output buffer included in the data input/output circuit 17 as a termination resistor.

The entire structure of the semiconductor device 10 according to this embodiment has been described thus far. Focusing on the data input/output circuit 17, the semiconductor device 10 of this embodiment will be explained in more detail as below.

Figure 2:
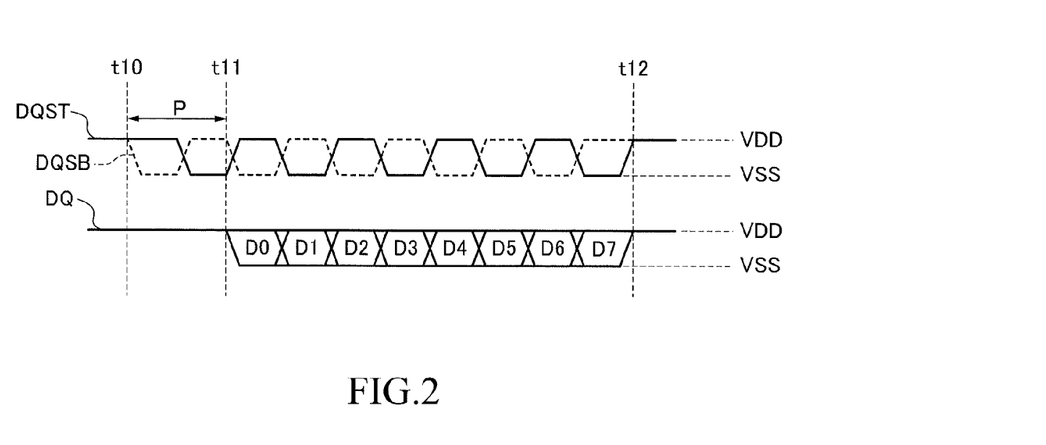
FIG. 2 is a timing chart showing waveforms of a read data and strobe signals during a read operation.

Turning to FIG. 2, a burst length is eight bits and the read data DQ is outputted serially during a period from a time t11 to a time t12. Here, the burst length means the number of bits of the data DQ outputted (or inputted) serially based on one column access. This basically corresponds to the number of the so-called pre-fetches, and is eight bits in DDR4 (Double Data Rate 4) SDRAM (Synchronous DRAM).

As shown in FIG. 2, the level of the data terminal 21 to output the read data DQ is fixed to the VDD level before the time t11. Similarly, the levels of the strobe terminals 22 and 23 to be output the strobe signals DQST and DQSB are also fixed to the VDD level. Clocking of the strobe signals DQST and DQSB is started from a time t10 that is earlier than the time t11 when burst output is started. The clocking of the strobe signals DQST and DQSB means the state in which the strobe signals DQST and DQSB become signals complementary to each other, one being the VDD level and the other being the VSS level, and the signal levels are inverted for every ½ clock cycle. A period P from the time t10 to the time 11 corresponds to a preamble period before executing the burst output of the read data DQ. According to the present embodiment, the time t10 when the clocking of the strobe signals DQST and DQSB is started may be referred to as "preparation timing", and the time t11 when the burst output is started may be referred to as "start timing".

At the time t11, the read data DQ is subjected to the burst output in synchronism with the clocking of the strobe signals DQST and DQSB. In FIG. 2, eight bits consisting of D0 to D7 are subjected to the burst output in this order. When the burst output is completed at the time t12, the levels of the terminals 21 to 23 return to the VDD level.

Thus, according to this embodiment, the level of the data terminal 21 is fixed to the VDD level except for the period when the read data DQ is subjected to the burst output (time t11 to time t12). Especially, when the termination signal ODT is activated before the time t10, the data terminal 21 is driven to the VDD level at a predetermined impedance. When the termination signal ODT is not activated before the time t10, on the other hand, the data terminal 21 is made to be in a high impedance state. Then the level of the data terminal 21 is driven to the VDD level by a device other than the semiconductor device 10. Although the ODT operation is not necessary during the period from the time t10 to the time t11, it is necessary that the data terminal 21 has the VDD level.

Figure 3:
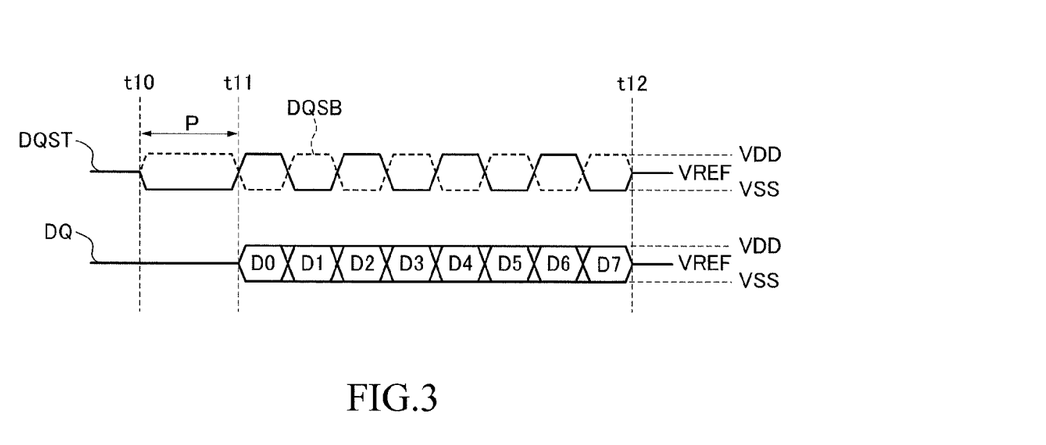
FIG. 3 is a timing chart showing waveforms that the inventors have conceived as a prototype in the course of making the present invention.

Turning to FIG. 3, that shows waveforms of the prototype, the level of the data terminal 21 is fixed to the VREF level before the time t11. The VREF level is an intermediate level between the VDD level and the VSS level, which can be defined as follows:

$$VREF=(VDD+VSS)/2$$

Similarly, the strobe signals DQST and DQSB are also fixed to the VREF level before the time t10. The clocking of the strobe signals DQST and DQSB is performed during the period from the time t10 to the time t12.

Figure 4:
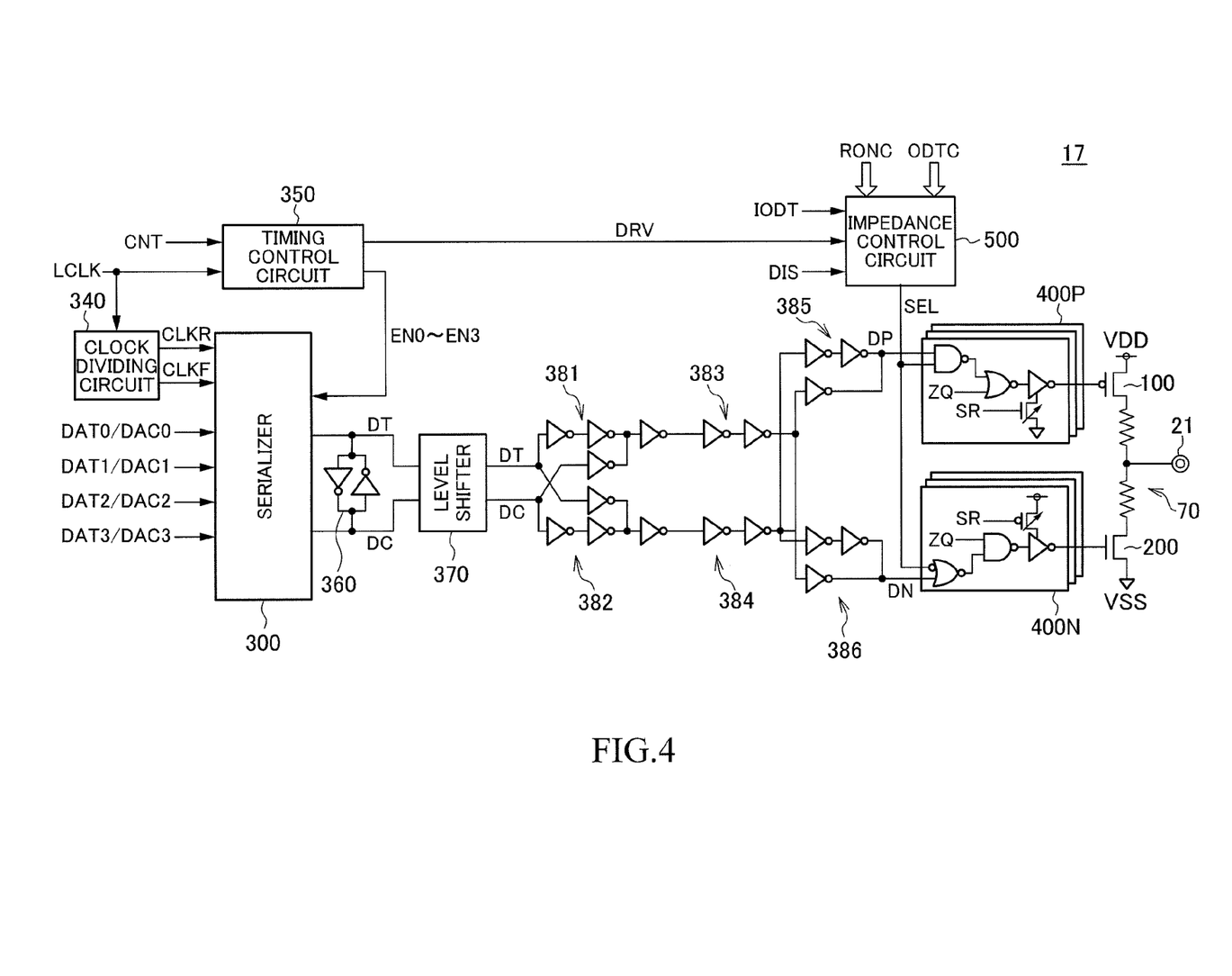
FIG. 4 is a circuit diagram showing an essential part of the data input/output circuit shown in FIG. 1.

As shown in FIG. 4, the data input/output circuit 17 includes an output buffer circuit 70 having a pull-up buffer circuit 100 and a pull-down buffer circuit 200. The pull-up buffer circuit 100 is connected between a power supply line supplying the power supply potential VDD and the data terminal 21, and the pull-down buffer circuit 200 is connected between a power supply line supplying the ground potential VSS and the data terminal 21. In FIG. 4, the pull-up buffer circuit 100 is illustrated by a symbol of one p-channel MOS transistor, but in actuality, it has a plurality of p-channel MOS transistors connected in parallel. Similarly, in FIG. 4, the pull-down buffer circuit 200 is illustrated by a symbol of one n-channel MOS transistor, but in actuality, it has a plurality of n-channel MOS transistors connected in parallel. Detailed circuit structures of the pull-up buffer circuit 100 and the pull-down buffer circuit 200 will be described later.

The power supply line supplying the power supply potential VDD is referred to as a "first power supply line" and the power supply line supplying the ground potential VSS is referred to as a "second power supply line". The pull-up buffer circuit 100 is referred to as a "first buffer circuit" and the pull-down buffer circuit 200 is referred to as a "second buffer circuit".

The data input/output circuit 17 is provided with a serializer 300 that performs on-off control of the pull-up buffer circuit 100 and the pull-down buffer circuit 200. The serializer 300 converts internal data signals DAT0/DAC0 to DAT3/DAC3 that are supplied in parallel and are complementary to each other into serial complementary data DT/DC. The internal data signals DAT0/DAC0 to DAT3/DAC3 are the internal read data read out from the memory cell array 11, and are supplied to the serializer 300 via the data controller 15 and the FIFO circuit 16.

Figure 5:
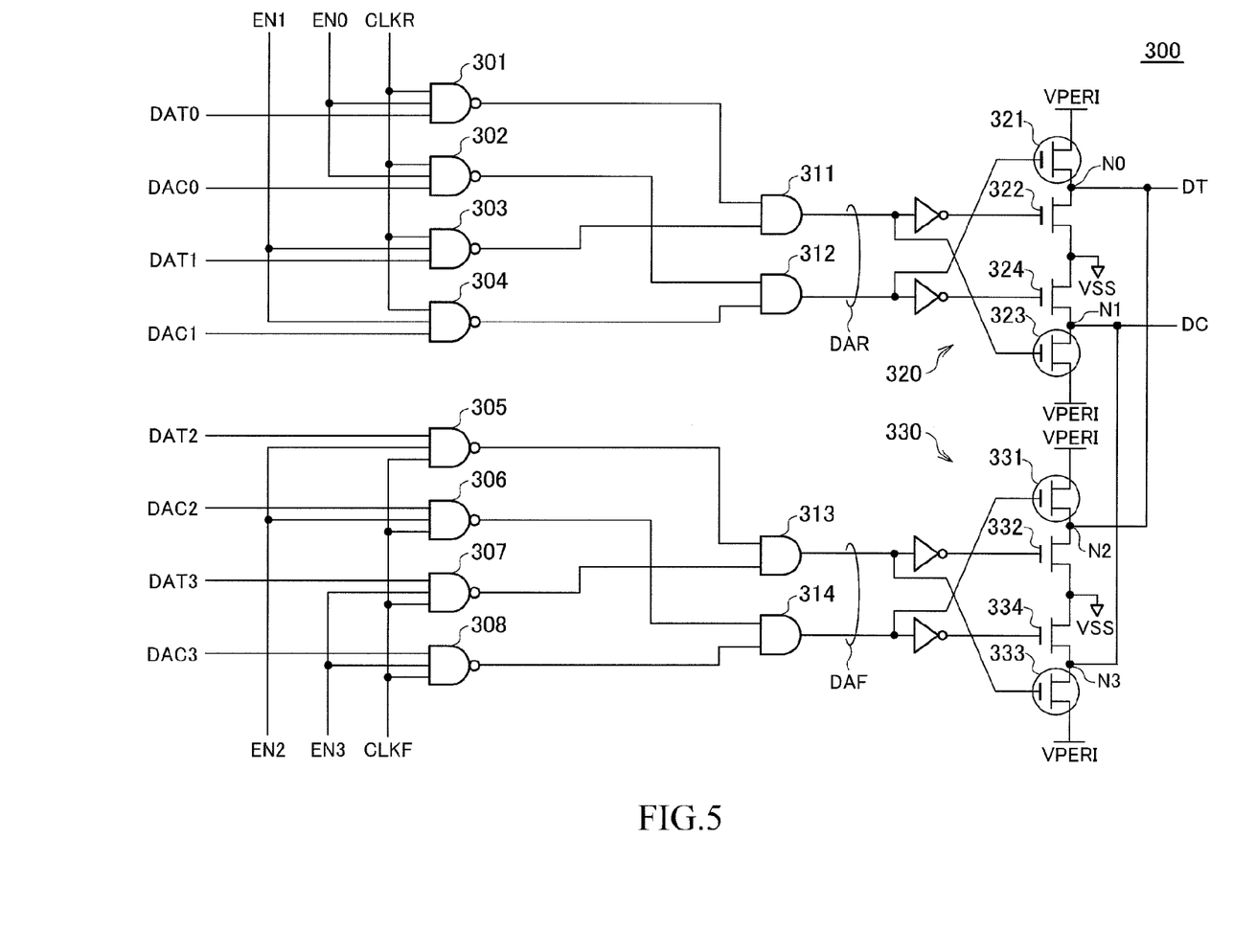
FIG. 5 is a circuit diagram of the serializer shown in FIG. 4.

Turning to FIG. 5, the serializer 300 includes three-input NAND gate circuits 301 to 308, two-input AND gate circuits 311 to 314, and tri-state buffer circuits 320 and 330. The corresponding internal data signals DAT0/DAC0 to DAT3/DAC3 are respectively supplied to first input nodes of the NAND gate circuits 301 to 308. A rising clock signal CLKR is supplied to second input nodes of the NAND gate circuits 301 to 304, and a falling clock signal CLKF is supplied to second input nodes of the NAND gate circuits 305 to 308. Further, an enable signal EN0 is supplied to third input nodes of the NAND gate circuits 301 and 302, an enable signal EN1 to third input nodes of the NAND gate circuits 303 and 304, an enable signal EN2 to third input nodes of the NAND gate circuits 305 and 306, and an enable signal EN3 to third input nodes of the NAND gate circuits 307 and 308.

The rising clock signal CLKR and the falling clock signal CLKF are complementary to each other, and generated by a clock dividing circuit 340 shown in FIG. 4. The clock dividing circuit 340 generates the rising clock signal CLKR and the falling clock signal CLKF that are complementary to each other based on the output clock signal LCLK generated by the DLL circuit 41.

The enable signals EN0 to EN3 are generated by a timing control circuit 350 shown in FIG. 4. The timing control circuit 350 is a circuit block that generates various signals in synchronism with the output clock signal LCLK based on a control signal CNT. The signals generated by the timing control circuit 350 include a drive signal DRV, other than the enable signals EN0 to EN3. At least the enable signal EN0 and the enable signal EN1 are not activated simultaneously, and the enable signal EN2 and the enable signal EN3 are not activated simultaneously. Accordingly, only one output signal of the NAND gate circuits 301 to 308 becomes the low level, and all of the remaining seven output signals become the high level.

The output signals of the NAND gate circuits 301 to 308 are supplied to corresponding input nodes of the AND gate circuits 311 to 314. Specifically, the output signals of the NAND gate circuits 301 and 303 are supplied to the AND gate circuit 311, the output signals of the NAND gate circuits 302 and 304 to the AND gate circuit 312, the output signals of the NAND gate circuits 305 and 307 to the AND gate circuit 313, and the output signals of the NAND gate circuits 306 and 308 to the AND gate circuit 314. Thereby, only one output signal of the AND gate circuits 311 to 314 becomes the low level, and all of the remaining three output signals become the high level.

Output signals DAR of the AND gate circuits 311 and 312 are supplied to the tri-state buffer circuit 320, and output signals DAF of the AND gate circuits 313 and 314 are supplied to the tri-state buffer circuit 330.

The tri-state buffer circuit 320 includes a p-channel MOS transistor 321 and an n-channel MOS transistor 322 that are connected in series between the power supply potential VPERI and the ground potential VSS, and a p-channel MOS transistor 323 and an n-channel MOS transistor 324 that are connected in series between the power supply potential VPERI and the ground potential VSS. The output signal of the AND gate circuit 312 is supplied to a gate electrode of the transistor 321, an inverted signal of the output signal of the AND gate circuit 311 is supplied to a gate electrode of the transistor 322, the output signal of the AND gate circuit 311 is supplied to a gate electrode of the transistor 323, and an inverted signal of the output signal of the AND gate circuit 312 is supplied to a gate electrode of the transistor 324. The signal DT as one of the complementary data is outputted from a node N0 that is a contact node between the transistors 321 and 322, and the signal DC as the other of the complementary data is outputted from a node N1 that is a contact node between the transistors 323 and 324.

The tri-state buffer circuit 330 includes a p-channel MOS transistor 331 and an n-channel MOS transistor 332 that are connected in series between the power supply potential VPERI and the ground potential VSS, and a p-channel MOS transistor 333 and an n-channel MOS transistor 334 that are connected in series between the power supply potential VPERI and the ground potential VSS. The output signal of the AND gate circuit 314 is supplied to a gate electrode of the transistor 331, an inverted signal of the output signal of the AND gate circuit 313 is supplied to a gate electrode of the transistor 332, the output signal of the AND gate circuit 313 is supplied to a gate electrode of the transistor 333, and an inverted signal of the output signal of the AND gate circuit 314 is supplied to a gate electrode of the transistor 334. The signal DT as one of the complementary data is outputted from a node N2 that is a contact node between the transistors 331 and 332, and the signal DC as the other of the complementary data is outputted from a node N3 that is a contact node between the transistors 333 and 334.

The node N0 of the tri-state buffer circuit 320 and the node N2 of the tri-state buffer circuit 330 are subjected to wired OR connection. Similarly, the node N1 of the tri-state buffer circuit 320 and the node N3 of the tri-state buffer circuit 330 are subjected to wired OR connection.

As described above, only one of the output signals of the AND gate circuits 311 to 314 becomes the low level, and all of the remaining three output signals become the high level. Accordingly, only one p-channel MOS transistor and one n-channel MOS transistor are always turned on, among the transistors constituting the tri-state buffer circuits 320 and 330, and all of the remaining transistors are turned off. When, for example, the output signal of the AND gate circuit 311 is the low level, only the transistors 322 and 323 are turned on, and therefore the node N0 is driven at the low level and the node N1 is driven at the high level. At this time, the nodes N2 and N3 of the tri-state buffer circuit 330 are in a high impedance state.

When the enable signals EN0 to EN3 are activated to the high level one by one according to the above-described structure, the internal data signals DAT0/DAC0 to DAT3/DAC3 that are inputted in parallel and are complementary to each other are converted by the serializer 300 into the serial complementary data DT/DC. During the period to output the read data DQ, the complementary data DT/DC control the pull-up buffer circuit 100 and the pull-down buffer circuit 200 in such a manner that one of these is turned on and the other is turned off based on a logic level of the read data DQ to be outputted. Meanwhile, during the period when the read data DQ is not outputted, that is, during the periods before and after outputting the read data DQ, the logic of the complementary data DT/DC is fixed so that the pull-up buffer circuit 100 is turned on and the pull-down buffer circuit 200 is turned off.

The circuit structure and the function of the serializer 300 have been described thus far. According to the present invention, the complementary data DT/DC may be referred to as a "first control signal".

Turning back to FIG. 4, the complementary data DT/DC are latched by a latch circuit 360 and level-shifted by a level shifter 370. The level shifter 370 is a circuit for shifting amplitude of the complementary data DT/DC from the VPERI level to the VDD level. This is because the amplitude of the read data DQ to be outputted to the outside of the semiconductor device 10 needs to have the VDD level that is equal to the external voltage, whereas the amplitude of the internal signals has the VPERI level. The complementary data DT/DC outputted from the level shifter 370 are phase-compensated by compensation circuits 381 and 382 and thereafter, transmitted via lines 383 and 384.

Specifically, the latch circuit 360 synthesizes an inverted signal (positive-phase signal) of the internal data signal DC (negative-phase signal) with the internal data signal DT (positive-phase signal), and synthesizes an inverted signal (negative-phase signal) of the internal data signal DT (positive-phase signal) with the internal data signal DC (negative-phase signal). The amplitude value of the internal data signal DT/DC is converted to the VDD level by the level shifter 370.

The complementary data DT/DC are binary signals, one of which has the high level and the other has the low level at all times. Therefore, a pair of the complementary signals can represent one-bit data only. This means that only the following two ways can be specified by the complementary data DT/DC, that is, either the pull-up buffer circuit 100 is turned on and the pull-down buffer circuit 200 is turned off or the pull-up buffer circuit 100 is turned off and the pull-down buffer circuit 200 is turned on. In other words, it is impossible for the complementary data DT/DC to turn on or off both of the pull-up buffer circuit 100 and the pull-down buffer circuit 200. Operation for turning on and off both of the buffer circuits 100 and 200, that is, enabling operation of the buffer circuits 100 and 200 is performed by an impedance control circuit 500 that will be described later.

The complementary data DT/DC transmitted via the lines 383 and 384 are converted into single-ended control signals DP and DN by regenerative circuits 385 and 386. The control signal DP is supplied to an output control circuit 400P, and the control signal DN is supplied to an output control circuit 400N. The output control circuit 400P is a circuit block for controlling the pull-up buffer circuit 100, and the output control circuit 400N is a circuit block for controlling the pull-down buffer circuit 200. In FIG. 4, the output control circuits 400P and 400N are represented by some gate circuit symbols, which are images for explaining functions of the output control circuits 400P and 400N and are not representing the actual circuit structures. According to the present embodiment, the output control circuits 400P and 400N may be referred to as "fourth control circuits".

Figure 6:
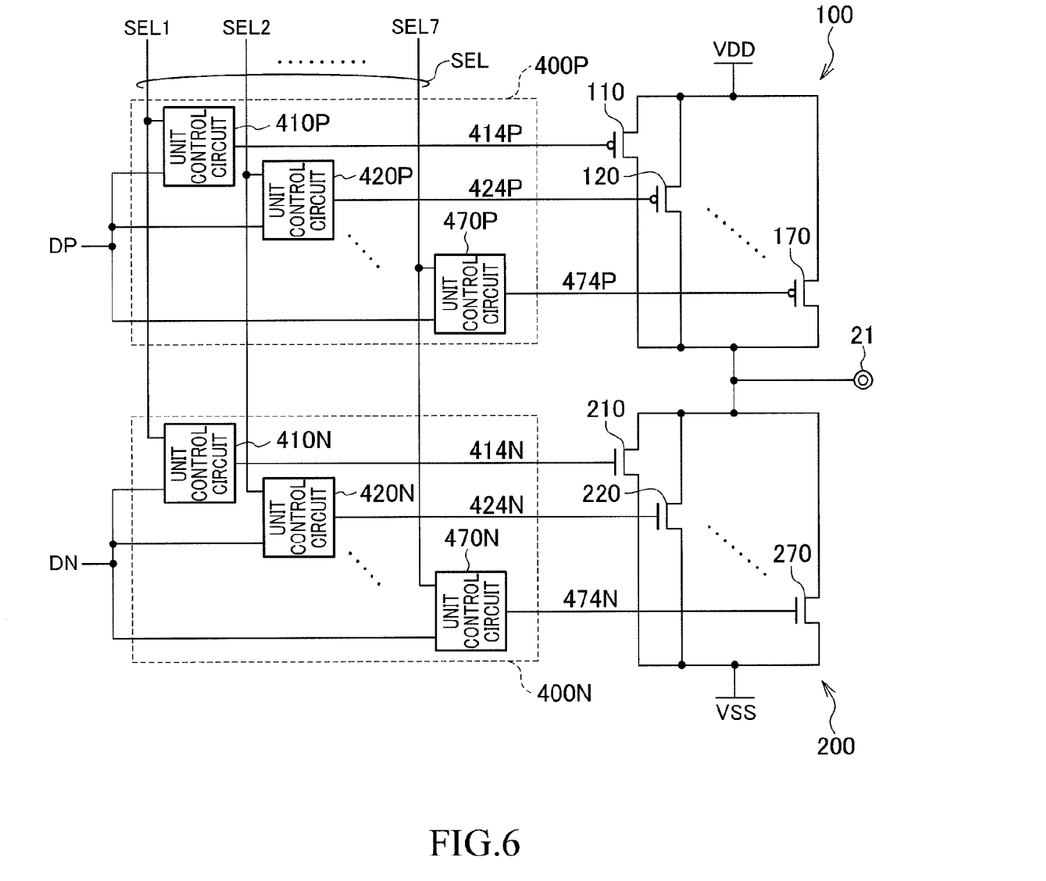
FIG. 6 is a circuit diagram showing the pull-up buffer circuit, the pull-down buffer circuit, and the output control circuits shown in FIG. 4.

Turning to FIG. 6, the pull-up buffer circuit 100 includes a plurality of unit buffer circuits that are connected in parallel between the power supply line supplying the power supply potential VDD and the data terminal 21. In this embodiment, the pull-up buffer circuit 100 includes seven unit buffer circuits 110 to 170, although the number is not particularly limited. The seven unit buffer circuits 110 to 170 have the same impedance, and the impedance of the pull-up buffer circuit 100 when it is activated can be selected by selecting the number of the unit buffer circuits to be activated simultaneously. The impedance of the respective unit buffer circuits 110 to 170 is adjusted to a designed value (240Ω, for example) by a not-shown calibration circuit. The result of the calibration operation is obtained as a calibration code ZQCP that will be described later. In FIG. 6, each of the unit buffer circuits 110 to 170 is represented by a symbol of a p-channel MOS transistor, but in actuality, each unit buffer circuit does not necessarily consist of one transistor.

Similarly, the pull-down buffer circuit 200 includes a plurality of unit buffer circuits that are connected in parallel between the power supply line supplying the ground potential VSS and the data terminal 21. In this embodiment, the pull-down buffer circuit 200 includes seven unit buffer circuits 210 to 270, although the number is not particularly limited. The seven unit buffer circuits 210 to 270 have the same impedance, and the impedance of the pull-up buffer circuit 200 when it is activated can be selected by selecting the number of the unit buffer circuits to be activated simultaneously. The impedance of the respective unit buffer circuits 210 to 270 is adjusted to a designed value (240Ω, for example) by a not-shown calibration circuit. The result of the calibration operation is obtained as a calibration code ZQCN that will be described later. In FIG. 6, each of the unit buffer circuits 210 to 270 is represented by a symbol of an n-channel MOS transistor, but in actuality, each unit buffer circuit does not necessarily consist of one transistor.

The unit buffer circuits 110 to 170 are respectively controlled by unit control circuits 410P to 470P that are included in the output control circuit 400P. The unit control circuits 410P to 470P are controlled by the control signal DP and corresponding selection signals SEL1 to SEL7. Similarly, the unit buffer circuits 210 to 270 are respectively controlled by unit control circuits 410N to 470N that are included in the output control circuit 400N. The unit control circuits 410N to 470N are controlled by the control signal DN and the corresponding selection signals SEL1 to SEL7. The selection signals SEL1 to SEL7 are signals generated by the impedance control circuit 500 shown in FIG. 4.

Figure 7:
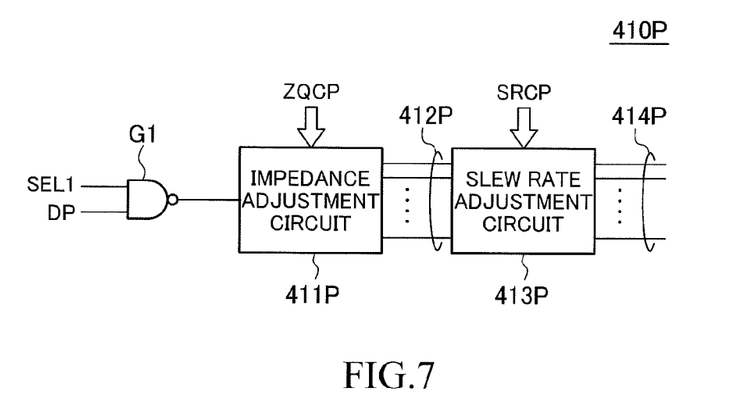
FIG. 7 is a circuit diagram of the unit control circuit 410P shown in FIG. 6.

As shown in FIG. 7, the unit control circuit 410P includes a NAND gate circuit G1 that receives the selection signal SEL1 and the control signal DP, an impedance adjustment circuit 411P that receives an output signal of the gate circuit G1, and a slew rate adjustment circuit 413P that receives an output signals of the impedance adjustment circuit 411P. When the output signal of the gate circuit G1 is activated to the low level, the impedance adjustment circuit 411P activates one or more bits of a control signal 412P consisting of a plurality of bits, based on the calibration code ZQCP. The slew rate adjustment circuit 413P adjusts change speed of the activated bit(s) of the control signal 412P, based on a slew rate code SRCP. The control signal 414P outputted from the slew rate adjustment circuit 413P is supplied to the unit buffer circuit 110.

Other unit control circuits 420P to 470P have the same circuit structure as that of the unit control circuit 410P shown in FIG. 7, except that the corresponding selection signals SEL2 to SEL7 are supplied thereto. The control signals 424P to 474P outputted from the unit control circuits 420P to 470P are supplied to the corresponding unit buffer circuits 120 to 170, respectively.

Figure 8:
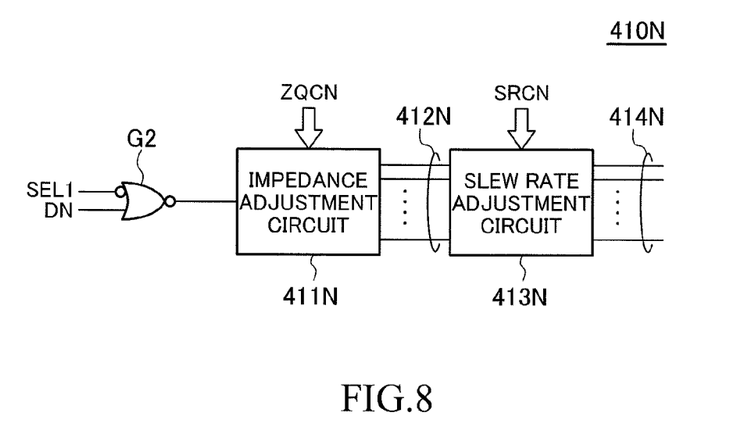
FIG. 8 is a circuit diagram of the unit control circuit 410N shown in FIG. 6.

As shown in FIG. 8, the unit control circuit 410N includes a NAND gate circuit G2 that receives the selection signal SEL1 and the control signal DN, an impedance adjustment circuit 411N that receives an output signal of the gate circuit G2, and a slew rate adjustment circuit 413N that receives an output signals of the impedance adjustment circuit 411N. When the output signal of the gate circuit G2 is activated to the high level, the impedance adjustment circuit 411N activates one or more bits of a control signal 412N consisting of a plurality of bits, based on the calibration code ZQCN. The slew rate adjustment circuit 413N adjusts change speed of the activated bit(s) of the control signal 412N, based on a slew rate code SRCN. The control signal 414N outputted from the slew rate adjustment circuit 413N is supplied to the unit buffer circuit 210.

Other unit control circuits 420N to 470N have the same circuit structure as that of the unit control circuit 410N shown in FIG. 8, except that the respective corresponding selection signals SEL2 to SEL7 are supplied thereto. The control signals 424N to 474N outputted from the unit control circuits 420N to 470N are supplied to the corresponding unit buffer circuits 220 to 270, respectively.

Figure 9:
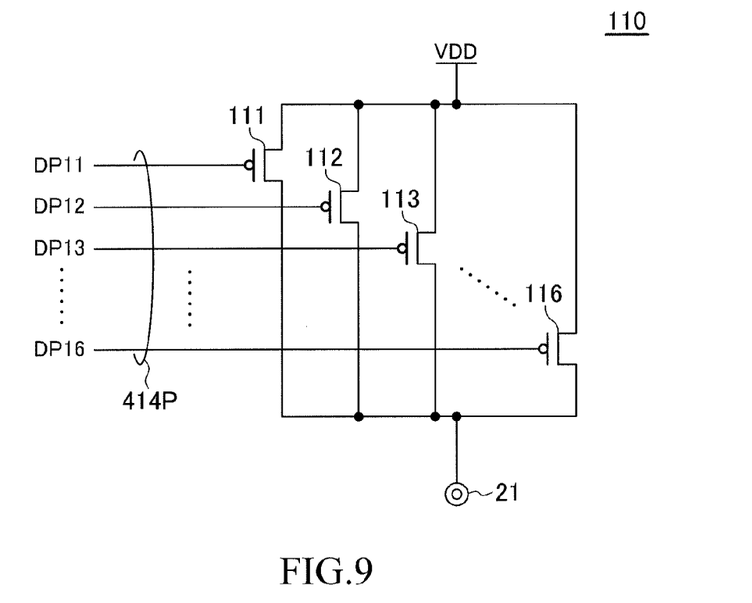
FIG. 9 is a circuit diagram of the unit buffer circuit 110 shown in FIG. 6.

As shown in FIG. 9, the unit buffer circuit 110 includes a plurality of p-channel MOS transistors 111 to 116 connected in parallel between the power supply line supplying the power supply potential VDD and the data terminal 21. Respective bits DP11 to DP16 constituting the control signal 414P are supplied to respective gate electrodes of the transistors 111 to 116. Thereby, the transistor corresponding to the low-level bit is turned on, among the respective bits DP11 to DP16 constituting the control signal 414P. A channel width of each of the transistors 111 to 115, among the transistors 111 to 116, is assigned a weight that is a power of two, although not particularly limited. Thus, on/off of the transistors 111 to 115 is specified based on the impedance code ZQCP. The transistor 116 is turned on without regard for the impedance code ZQCP.

Other unit buffer circuits 120 to 170 have the same circuit structure as that of the unit buffer circuit 110, except that the corresponding control signals 424P to 474P are supplied thereto.

Figure 10:
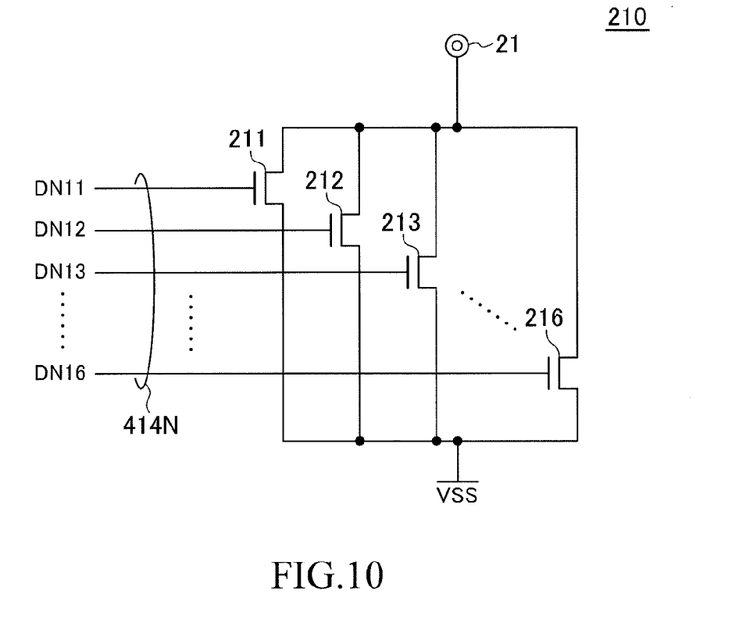
FIG. 10 is a circuit diagram of the unit buffer circuit 210 shown in FIG. 6.

As shown in FIG. 10, the unit buffer circuit 210 includes a plurality of n-channel MOS transistors 211 to 216 connected in parallel between the power supply line supplying the ground potential VSS and the data terminal 21. Respective bits DN11 to DN16 constituting the control signal 414N are supplied to respective gate electrodes of the transistors 211 to 216. Thereby, the transistor corresponding to the high-level bit is turned on, among the respective bits DN11 to DN16 constituting the control signal 414N. A channel width of each of the transistors 211 to 215, among the transistors 211 to 216, is assigned a weight that is a power of two, although not particularly limited. Thus, on/off of the transistors 211 to 215 is specified based on the impedance code ZQCN. The transistor 216 is turned on without regard for the impedance code ZQCN.

Other unit buffer circuits 220 to 270 have the same circuit structure as that of the unit buffer circuit 210, except that the corresponding control signals 424N to 474N are supplied thereto respectively.

Figure 11:
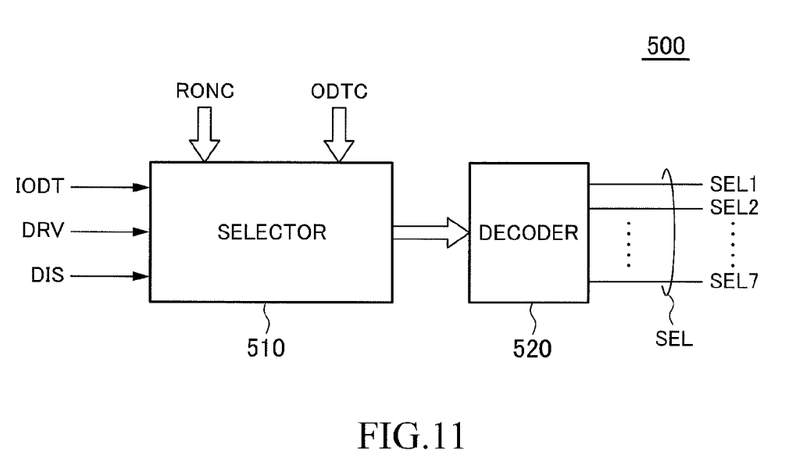
FIG. 11 is a block diagram showing the structure of the impedance control circuit shown in FIG. 4.

Turning to FIG. 11, the impedance control circuit 500 includes a selector 510 that receives the impedance codes RONC and ODTC, and a decoder 520 that decodes an output signals of the selector 510. The impedance code RONC is a signal that specifies the impedance when the pull-up buffer circuit 100 and the pull-down buffer circuit 200 are allowed to function as output circuits. Meanwhile, the impedance code ODTC is a signal that specifies the impedance when the pull-up buffer circuit 100 is allowed to function as a termination resistor. The pull-up buffer circuit 100 is allowed to function as the termination resistor when the termination signal ODT inputted in the ODT terminal 33 shown in FIG. 1 is activated. In this embodiment, the data terminal 21 has the termination level of VDD, and hence the pull-down buffer circuit 200 is not used as the termination resistor. The impedance codes RONC and ODTC need not to be fixed and preferably may be switched according to a set value of the mode register 42.

Figure 12:
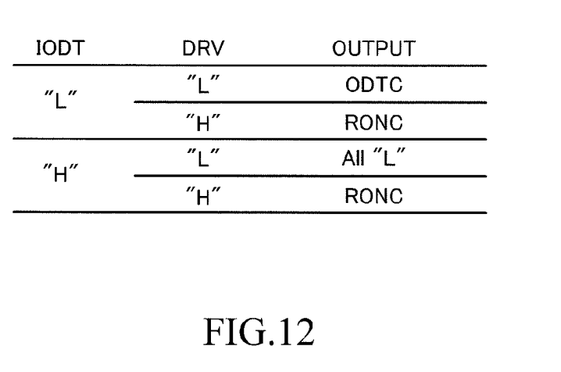
FIG. 12 is a truth table for explaining the selector shown in FIG. 11.

A termination signal IODT, a drive signal DRV and a disable signal DIS supplied to the selector are used to determine which of the impedance codes RONC and ODTC to be selected. The termination signal IODT is a signal activated to the low level in performing the CDT operation, and activated based on the termination signal ODT inputted into the ODT terminal 33. The drive signal DRV is a signal activated to the high level in performing output operation of the read data DQ. The disable signal DIS is a signal activated when the output buffer circuit 70 is made to be in the high impedance state. The impedance code RONC or ODTC is selected according to a truth table shown in FIG. 12. In this embodiment, the state in which the impedance code ODTC is selected may be referred to as a "first control state", and the state in which the impedance code RONC is selected may be referred to as a "second control state". Further, the impedance control circuit 500 may be referred to as a "second control circuit".

The drive signal DRV is a signal generated by the timing control circuit 350 shown in FIG. 4. By activating the drive signal DRV in synchronism with an output timing of the read data DQ, the timing control circuit 350 switches the output buffer circuit 70 that is performing the CDT operation to perform the output operation of the read data DQ, or switches the output buffer circuit 70 that is in the high impedance state to perform the output operation of the read data DQ. It is needless to say that the opposite control is also possible, that is, the output buffer circuit 70 that is performing the output operation of the read data DQ may be switched to perform the ODT operation, or to be in the high impedance state. According to the present embodiment, the timing control circuit 350 may be referred to as a "third control circuit".

The impedance code RONC or ODTC that is selected by the selector 510 is supplied to the decoder 520. Based on the impedance code, the decoder 520 controls the number of the selection signals SEL1 to SEL7 to be activated. As described above, the selection signals SEL1 to SEL7 are signals for activating the corresponding unit buffer circuits 110 to 170 and 210 to 270, respectively. As the number of the selection signals SEL1 to SEL7 to be activated increases, the impedance of the pull-up buffer circuit 100 or the pull-down buffer circuit 200 in the on-state is reduced. According to the present invention, the selection signals SEL1 to SEL7 may be referred to as "second control signals".

Figure 13:
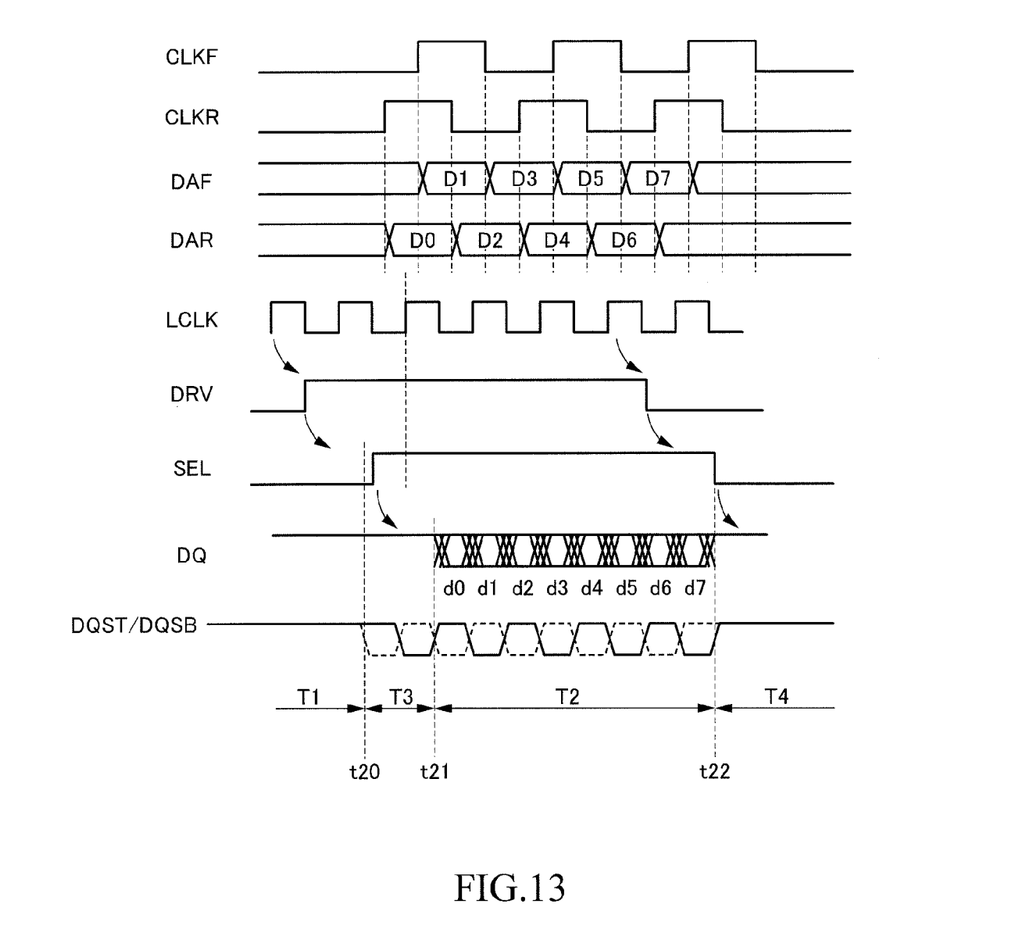
FIG. 13 is a timing chart for explaining the output operation of the read dada according to one example.

According to one example shown in FIG. 13, the clocking of the strobe signals DQST/DQSB is started at a time t20, and the output of the read data DQ is started from a time t21 that is one clock cycle after the time t20. The output operation of the read data DQ is completed at a time t22. Therefore, the data terminal 21 needs to have the VDD level in control periods T1 and T3 before the time t21 and a control period T4 after the time t22.

In order to achieve this, it is necessary to perform the ODT operation by turning on the pull-up buffer circuit 100 only, or to allow the data terminal 21 to be in the high impedance state by turning off both of the pull-up buffer circuit 100 and the pull-down buffer circuit 200, during the control periods T1, T3 and T4. In performing the ODT operation, the impedance of the pull-up buffer circuit 100 needs to be controlled based on the impedance code ODTC. As described above, the impedance is controlled based on the impedance code ODTC by selecting the number of the unit buffer circuits 110 to 170 to be activated.

Meanwhile, during a control period T2 between the time t21 to the time t22, it is necessary to turn on either one of the pull-up buffer circuit 100 and the pull-down buffer circuit 200 and turn off the other, based on the logic level of the read data DQ to be outputted. In the output operation of the read data DQ, the impedance of the pull-up buffer circuit 100 needs to be controlled based on the impedance code RONC. The impedance is also controlled based on the impedance code RONC by selecting the number of the unit buffer circuits 110 to 170 and 210 to 270 to be activated.

Here, the timing to start the output of the read data DQ needs to coincide with the time 21 with precision. Such timing control is performed precisely by the serializer 300. On the other hand, it is not necessarily required to coincide the timing to switch the impedance of the pull-up buffer circuit 100, from the impedance based on the impedance code ODTC to the impedance based on the impedance code RONC, with the time t21. This is because the level of the data terminal 21 during the control period T1 before the time t20 and the level of the data terminal 21 during the control period T3 between the time t20 to the time t21 are equal to each other, and a change in the impedance of the pull-down buffer circuit 200 during the periods does not substantially affect other semiconductor devices connected to the semiconductor device 10.

Therefore, the timing to change the selection signals SEL1 to SEL7 may be at any moment as long as it is within the control period T3 from the time t20 to the time t21, which eliminates the need to strictly control the timing by using the output clock signal LCLK. As a result of this, as shown in FIG. 4, the selection signals SEL1 to SEL7 that specify the impedance of the pull-up buffer circuit 100 and the pull-down buffer circuit 200 can be inputted into the output control circuits 400P and 400N that are provided just before the buffer circuits 100 and 200, not into the serializer 300. In FIG. 13, the change in the selection signal SEL is schematically represented in binary. In FIG. 13, the low level of the selection signal SEL means that the impedance code ODIC is selected, and the high level of the selection signal SEL means that the impedance code RONC is selected.

Figure 14:
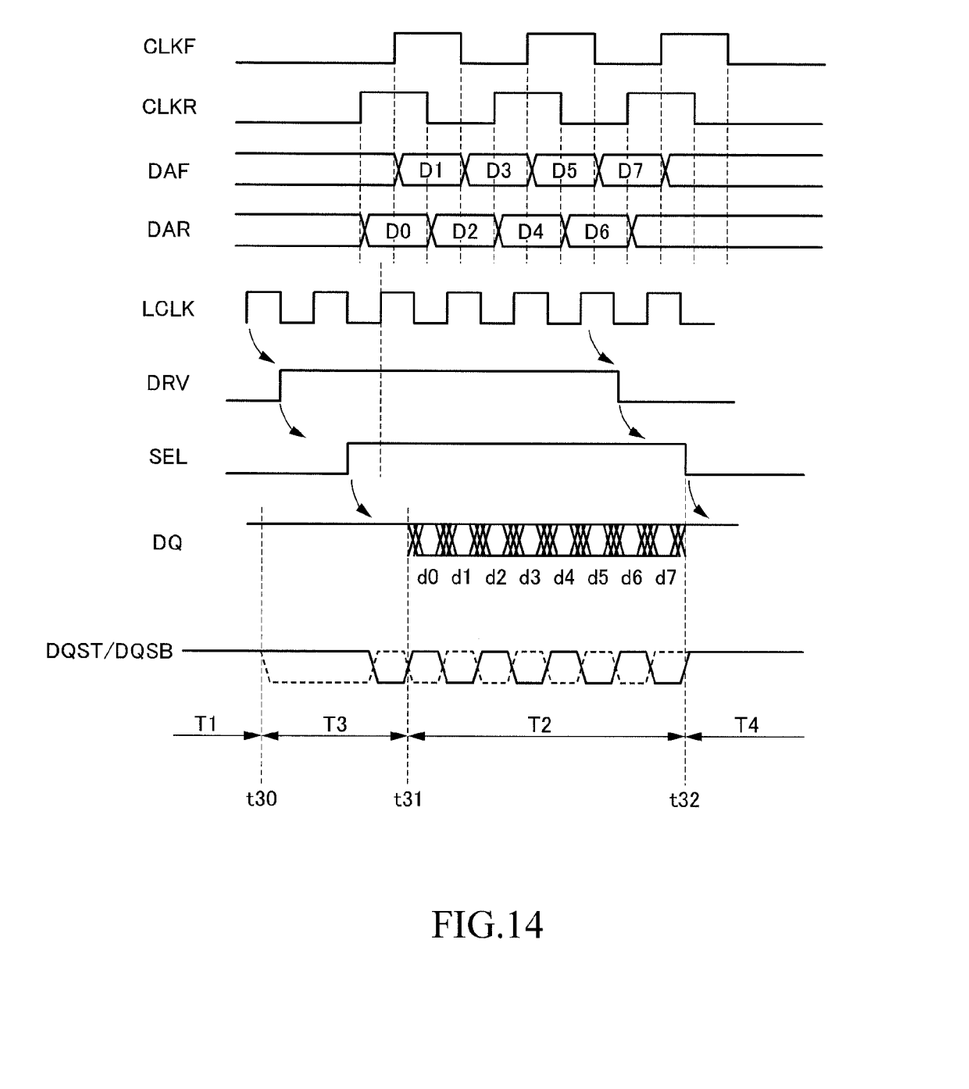
FIG. 14 is a timing chart for explaining the output operation of the read data according to another example.

FIG. 14 is a timing chart explaining the output operation of the read data DQ according to another example. According to the example shown in FIG. 14, the clocking of the strobe signals DQST/DQSB is started at a time t30, and the output of the read data DQ is started at a time t31 that is two clock cycles after the time t30. The output operation of the read data DQ is completed at a time t32. When the so-called preamble period is thus increased, a timing margin to switch the impedance of the pull-up buffer circuit 100 is also increased correspondingly.

Figure 15:
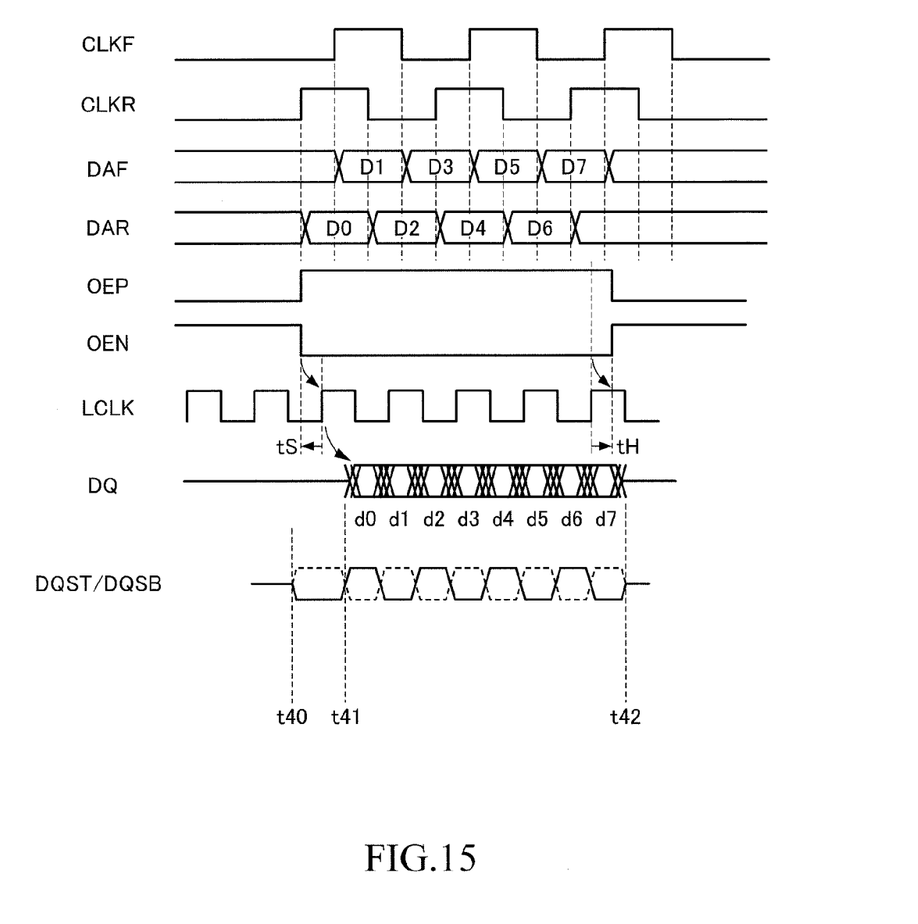
FIG. 15 is a timing chart that the inventors have conceived as a prototype in the course of making the present invention.

According to the prototype example shown in FIG. 15, the clocking of the strobe signals DQST/DQSB is started at a time t40, and the output of the read data DQ is started at a time t41 that is one clock cycle after the time t40. The output operation of the read data DQ is completed at a time t42. According to this prototype example, the termination level of the data terminal 21 is set to be VDD/2 as explained with reference to FIG. 3. In this case, the timing to switch the impedance of the output buffer circuit 70 needs to precisely coincide with the timing to start the output of the read data DQ. This means that it is necessary to input a signal for switching the impedance of the output buffer circuit 70 into the serializer. In FIG. 15, a signal to switch the impedance of the pull-up buffer circuit 100 is represented as OEP, and a signal to switch the impedance of the pull-down buffer circuit 200 is represented as OEN. Thus, according to this prototype example, the signals OEP and OEN need to be inputted into the serializer, which makes the timing margin severe irrespective of the length of the preamble period. In FIG. 15, a setup margin is represented as tS, and a hold margin is represented as tH.

On the contrary, the present embodiment has no such problems, and allows plenty of time to switch the impedance.

It is apparent that the present invention is not limited to the above embodiments, but may be modified and changed without departing from the scope and spirit of the invention.

According to the above-described embodiment, for example, the complementary signals DT/DC are employed as the signals to be outputted from the serializer 300, but it is not necessarily required to use the signals that are complementary to each other. It is acceptable to employ a single-ended binary signal of one-bit.

Further, according to the above-described embodiment, the termination level is set to the VDD level, but it may be the VSS level.

What is claimed is:
1. A semiconductor device comprising:
a data terminal;
a first power supply line supplying a first potential;
a second power supply line supplying a second potential different from the first potential;
a first buffer circuit coupled between a first power supply line and the data terminal;
a second buffer circuit coupled between a second power supply line and the data terminal;
a first control circuit activating the first buffer circuit and deactivating the second buffer circuit during a period before a start timing when an output operation of a data signal from the data terminal is started, and activating one of the first and second buffer circuits and deactivating the other of the first and second buffer circuits based on a logic level of the data signal to be outputted from the data terminal during a period after the start timing;
a second control circuit controlling an impedance of the first buffer circuit to a first value in a first control state, and controlling an impedance of the activated one of the first and second buffer circuits to a second value in a second control state; and
a third control circuit bringing the second control circuit into the first control state before preparation timing prior to the start timing, and bringing the second control circuit into the second control state after the start timing, the third control circuit changing the second control circuit from the first control state to the second control state during a period from the preparation timing to the start timing.

2. The semiconductor device as claimed in claim 1, further comprising:
a strobe terminal; and
a strobe circuit outputting a strobe signal from the strobe terminal in synchronism with the data signal,
wherein the strobe circuit starts clocking of the strobe signal from the preparation timing.

3. The semiconductor device as claimed in claim 1, wherein the second control circuit allows the first buffer circuit to function as a termination resistor in the first control state.

4. The semiconductor device as claimed in claim 1, wherein the second control circuit allows the first buffer circuit to be in a high impedance state in the first control state.

5. The semiconductor device as claimed in claim 1, wherein the first control circuit selects either one of the first and second buffer circuits using a first control signal that is a binary form.

6. The semiconductor device as claimed in claim 5, wherein the first control signal is one-bit data using a pair of complementary signals.

7. The semiconductor device as claimed in claim 5, wherein
each of the first and second buffer circuits includes a plurality of unit buffer circuits connected in parallel, and
the second control circuit controls the impedance of the first and second buffer circuits by supplying a second control signal that selects a number of the unit buffer circuits to be activated to the first and second buffer circuits.

8. The semiconductor device as claimed in claim 7, further comprising a fourth control circuit synthesizing the first control signal and the second control signal,
wherein the first and second buffer circuits are activated or deactivated based on an output signal of the fourth control circuit.

9. The semiconductor device as claimed in claim 1, further comprising a mode register in which the first and second values are set.

10. A method of controlling a semiconductor device, the method comprising:
activating or deactivating a first buffer circuit and deactivating a second buffer circuit during a first control period, the first and second buffer circuits being electrically connected in series between first and second power supply lines;

activating one of the first and second buffer circuits and deactivating the other of the first and second buffer circuits during a second control period based on a logic level of a data signal to be outputted from a data terminal connected between the first and second buffer circuits;

setting impedance of the first buffer circuit to a first value during the first control period;

setting impedance of the activated one of the first and second buffer circuits to a second value during the second control period; and changing the impedance of the first buffer circuit from the first value to the second value during a third control period that is defined as a period from an end of the first control period to a start of the second control period.

11. The method of controlling the semiconductor device as claimed in claim 10, wherein, when a termination signal is activated, the first buffer circuit is activated and the second buffer circuit is deactivated during the first control period.

12. The method of controlling the semiconductor device as claimed in claim 10, wherein, when a disable signal is activated, the first and second buffer circuits are deactivated during the first control period.

13. A semiconductor device comprising:
a first buffer circuit electrically connected to a terminal;
a second buffer circuit electrically connected to the terminal;
an output control circuit activating the first buffer circuit and deactivating the second buffer circuit in a first state, and activating one of the first and second buffer circuits and deactivating the other of the first and second buffer circuits based on input data in a second state; and
a first control circuit bringing the output control circuit into one of at least the first and second states,
wherein the input data comprises first and second input data complementary to each other, and
wherein the semiconductor device comprises a regenerative circuit supplying the first input data and an inverted signal of the second input data to the first buffer circuit, and supplying the second input data and an inverted signal of the first input data to the second buffer circuit.

14. The semiconductor device as claimed in claim 13, further comprising a serializer outputting the input data in a serial form by converting a parallel form into the serial form.

15. The semiconductor device as claimed in claim 14, further comprising a timing control circuit controlling an operation of the first control circuit and the serializer.

16. The semiconductor device as claimed in claim 15, further comprising a DLL circuit supplying a timing signal to the timing control circuit.

17. The semiconductor device as claimed in claim 14, further comprising a level shifter that changes an amplitude of the input data outputted from the serializer in a complementary form.

18. The semiconductor device as claimed in claim 13, further comprising a pair of signal paths to transmit the first and second input data to the regenerative circuit.

* * * * *